United States Patent
Beck

(10) Patent No.: US 9,238,862 B2
(45) Date of Patent: Jan. 19, 2016

(54) METHOD AND DEVICE FOR APPLYING OR EMBEDDING PARTICLES ONTO OR INTO A LAYER APPLIED BY PLASMA COATING

(75) Inventor: Uwe Beck, Falkensee (DE)

(73) Assignee: BAM Bundesanstalt fuer Materialforschung und—Pruefung (DE)

( * ) Notice: Subject to any disclaimer, the term of this patent is extended or adjusted under 35 U.S.C. 154(b) by 468 days.

(21) Appl. No.: 13/127,123

(22) PCT Filed: Oct. 9, 2009

(86) PCT No.: PCT/EP2009/007384
§ 371 (c)(1),
(2), (4) Date: May 2, 2011

(87) PCT Pub. No.: WO2010/049064
PCT Pub. Date: May 6, 2010

(65) Prior Publication Data
US 2011/0212276 A1    Sep. 1, 2011

(30) Foreign Application Priority Data

Oct. 30, 2008  (DE) .......................... 10 2008 055 648
May 8, 2009   (DE) .......................... 10 2009 021 056

(51) Int. Cl.
C23C 14/00   (2006.01)
C23C 14/34   (2006.01)

(52) U.S. Cl.
CPC .................................. *C23C 14/3407* (2013.01)

(58) Field of Classification Search
CPC ........................ C23C 14/223; C23C 14/3407
USPC ........ 204/192.1, 192, 12, 22, 298.07, 298.19; 427/474, 569; 118/723 E
See application file for complete search history.

(56) References Cited

U.S. PATENT DOCUMENTS 4,299,678 A  *  11/1981  Meckel ...................... 204/192.2
4,801,435 A       1/1989  Tylko
(Continued)

FOREIGN PATENT DOCUMENTS

| JP | 57111031 A | * | 7/1982 |
| JP | 05320891 A | * | 12/1993 |
| JP | 09268379 A |   | 10/1997 |

OTHER PUBLICATIONS

Kersten, et al: "Surface Modification of Powder Particles by Plasma Deposition of Thin Metallic Films", XP002561655, Oct. 10, 1998, pp. 507-512, vol. 108-109, No. 1-3.

(Continued)

*Primary Examiner* — John Brayton
(74) *Attorney, Agent, or Firm* — Dicke, Billig & Czaja, PLLC

(57) ABSTRACT

A method for applying or embedding nanoparticles or microparticles of any substance in a defined manner onto or into a layer to be applied to a substrate surface by plasma coating before, during or after the plasma coating operation in a magnetron or plasmatron. The particles are introduced from the outside into the vacuum chamber of the magnetron or plasmatron via at least one pressure stage. The particles are spatially distributed in the plasma space between the target and the substrate. The particles in the plasma space are preferably exposed to an electric field generating a movement of the particles toward the substrate. It is advantageous for this purpose if the particles are electrically charged before being introduced into the plasma space.

17 Claims, 2 Drawing Sheets

(56) References Cited

U.S. PATENT DOCUMENTS

| | | | |
|---|---|---|---|
| 4,940,523 A * | 7/1990 | Takeshima | 204/192.12 |
| 5,322,605 A * | 6/1994 | Yamanishi | 204/298.07 |
| 5,622,567 A * | 4/1997 | Kojima et al. | 118/726 |
| 6,454,862 B1 * | 9/2002 | Yoshida et al. | 118/722 |
| 2001/0031564 A1 * | 10/2001 | Suzuki et al. | 438/962 |
| 2004/0134770 A1 * | 7/2004 | Petersen | 204/192.38 |

OTHER PUBLICATIONS

Kersten, et al: "Plasma-Powder Interaction: Trends in Applications and Diagnostics", XP004397005, Jan. 15, 2003, pp. 313-325, vol. 223-224.

* cited by examiner

METHOD AND DEVICE FOR APPLYING OR EMBEDDING PARTICLES ONTO OR INTO A LAYER APPLIED BY PLASMA COATING

BACKGROUND OF THE INVENTION

Field of the Invention

The invention relates to a method for applying or embedding nano-particles or micro-particles of at least one substance of any type in a defined manner onto or into a layer applied to a substrate surface by plasma coating, the method being applied in a magnetron or plasmatron prior to, during or after the plasma coating procedure. The invention also relates to a device for carrying out this method.

In electrochemically deposited layers (for example Ni dispersion layers), it has long been known to introduce foreign particles in order to obtain properties which are desired. Particle embedding to obtain add-on properties or to change the surface topography is also known for varnishes or sol-gel layers; they are also deposited from the liquid phase. Specific liquid phase coating techniques (SAMs, or self-assembling monolayers) and LBL (layer-by-layer) techniques are also suitable for producing particulate surface layers.

However, there are currently no commercial solutions for vacuum-based plasma coating methods. In principle, auxiliary sources such as hollow cathode sources or plasma jets, which are outside the magnetron or plasmatron, are capable of producing particles and also of introducing them into layers. Both sources, i.e. the actual coating source which produces the layer matrix, and the auxiliary source, have to be directed simultaneously onto the substrate, leading to geometrical- and plasma-related problems. Thus, until now such a coating could only been tested in pilot plants, with the result that inhomogeneities in the modified layers could not be avoided. In addition, such auxiliary sources cannot be used to introduce any kind of particle, but only those which are capable of being applied by sputter, arc or plasma jet techniques. The term "particles" herein encompasses only clusters of materials or mixtures of materials. In total, the combination of two sources leads to major practical problems, not only because of geometrical problems, but also because of electrotechnical plasma-related and control-related problems. Even the space requirement and the costs of such a coating unit are high.

BRIEF SUMMARY OF THE INVENTION

It is thus the aim of the present invention to provide a method for applying or embedding nano- or micro-particles of at least one substance of any type in a defined manner onto or into a layer to be applied to a substrate surface by plasma coating prior to, during or after the plasma coating procedure in a magnetron or plasmatron which, at relatively low cost, permits the particles to be substantially homogenously distributed on or in the layer matrix, so that the desired properties of the layer can be obtained. With regard to the nature of the particles used, restrictions should be as small as possible.

This object is achieved by means of a method as claimed. Advantageous further embodiments of this method and a device for carrying it out are set out in the dependent claims.

Because any externally produced or modified particles are introduced into the vacuum chamber of the magnetron or plasmatron from outside via at least one pressure stage and in a spatially distributed manner into the plasma space between the target and substrate, the particles are not supplied from a spatially concentrated source in a directed manner, but they can be introduced into the plasma space in a spatially homogenous manner and thus can be deposited on the substrate in a homogenously distributed manner.

The particles are preferably introduced into the plasma space between the target and the substrate using a flushing gas such as argon or nitrogen from outside, i.e. the non-vacuum side of the magnetron or plasmatron. The supply occurs via small holes or nozzles which are distributed linearly or areally such that the introduction is as homogenous as possible. Therein, the supply occurs preferably to a target region where the target is not or is only slightly eroded, i.e. outside the primary target erosion zone. In the plasma space, the particles are subjected to the electric field of the plasma space or to a static or dynamic alternating electric field. A charge transfer unit downstream of the pressure step forms electrical surface charges on the particles, for example using an electron shower, static electricity or the like. These thus-charged particles have on the one hand a much lower tendency to agglomerate than uncharged particles, and on the other hand, since they are negatively electrically charged, they can be accelerated by the electric field from the target (negative potential) to the substrate (positive potential). For particle materials such as metals, which are conductive per se and cannot be charged or are difficult to charge, the particles may be provided with non-conductive coatings which might also provide the particles with plasma resistance; they may, for example, be produced from $SiO_2$. Further, it is also possible for particles which are already charged to be electrically neutralized by the charge transfer unit and to be introduced into the vacuum chamber in an uncharged state.

The method of the invention can thus be used to introduce externally produced nano- or micro-particles, in the form of powders or fine granulates, via at least one pressure stage or possibly using a charge transfer unit, preferably into the region outside the target erosion zone, as charged or uncharged species into the vacuum chamber of a magnetron or plasmatron, and to emit them therefrom into the plasma space between the target and substrate and apply them to the substrate in a finely dispersed manner. This can be carried out either during, before or after a plasma coating procedure, i.e. both in the presence and also in the absence of a plasma. The particles can thus be embedded into the matrix of the plasma-coated material or form its own layer under or over the matrix. It is also possible to produce layers between individual matrix layers. Particle injection is thus typically carried out for only a short period in the form of a single pulse or a sequence of pulses.

By the supplied particles the properties of the layer can be influenced in many ways. The range of applications encompasses marker particles and functional particles such as dry lubricants, coloured pigments, formation of reservoirs, topographical functions, fluorescence and the like.

The invention will now be described in more detail with reference to an working example illustrated in the drawings, in which:

DESCRIPTION OF THE INVENTION

Figure 1:
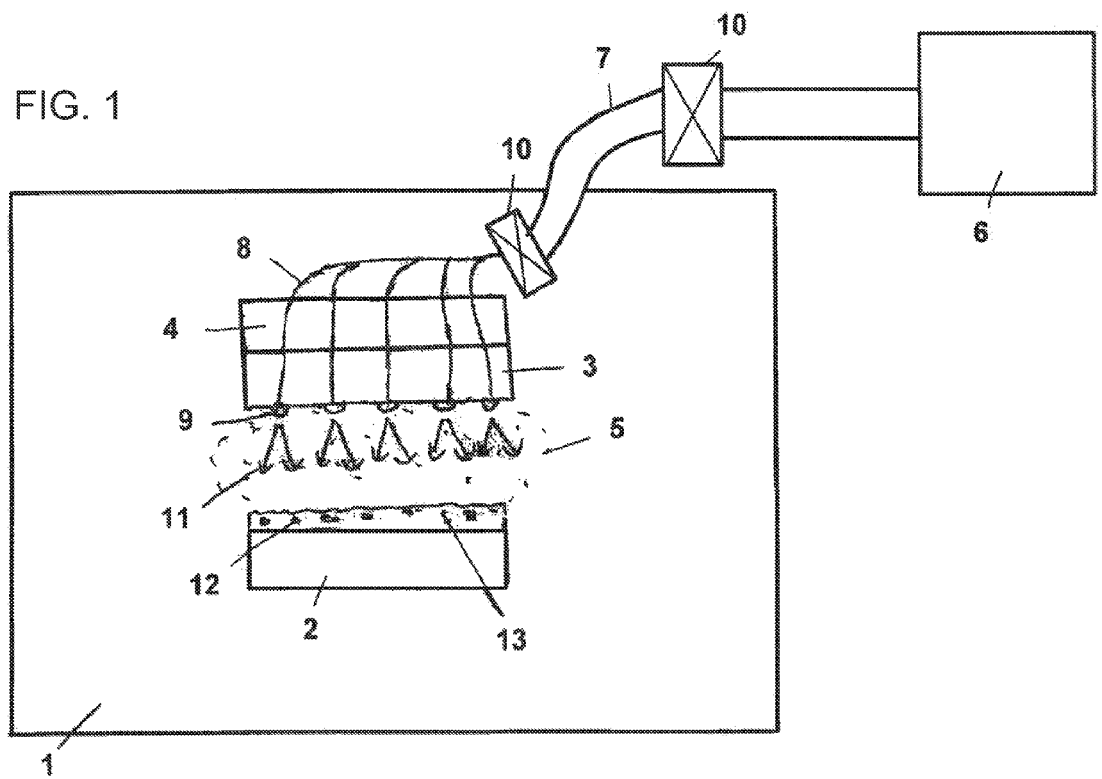
FIG. 1 is a diagrammatic cross-sectional representation of a plasma coating unit.

A substrate 2 to be coated and its surface to be coated are positioned opposite to a target 3 in a vacuum processing chamber 1. On the side facing away from the substrate 2, the target 3 is connected to a magnetron or plasmatron 4 for producing the energy required for the formation of a plasma 5 between the substrate 2 and target 3.

A processing pressure, typically $10^{-3}$ mbar, is maintained in the vacuum processing chamber 1. Argon is preferably used for this purpose; together with a reactive gas, it forms the processing plasma 5 for applying the coating.

In accordance with the invention, this heretofore known plasma coating unit is supplemented by a special device for introducing particles into the vacuum processing chamber 1. This device essentially consists of a storage container 6 for the particles, a transport pipe 7 to convey the particles from the storage container 6, a pipe manifold system connected thereto and formed from a plurality of parallel pipes 8 which are guided through the magnetron or plasmatron 4 and the target 3, each opening in a nozzle 9 on the lower side of the target 3, at least two piezoelectrically actuatable valves 10 which are arranged one behind the other in the path of the transport pipe 7, as well as a charge transfer unit, if necessary and not shown, which can be provided at a suitable location in the path of the particles between the storage container 6 and the location at which the pipes 8 enter the magnetron or plasmatron 4.

The valves 10 serve to maintain a pressure difference between the storage container 6, the interior of which is preferably kept at atmospheric pressure, and the vacuum processing chamber 1. In order to further increase operational safety, more than two such valves may also be used. The particles can be dispersed in the storage container in powder or dust form, as liquids or vapours, or in form of aerosols. They may be present in an electrically charged or uncharged state.

The valves 10 are controlled in a manner such that the particles are injected intermittently because of the pressure difference in a transport medium from the storage container 6 into the vacuum processing chamber 1 or the processing plasma 5. They are expelled from the respective nozzles 9 in divergent streams 11. In this manner, they are evenly distributed in the space between the substrate 2 and the target 3 and are deposited on the substrate 2. This process is accelerated if the particles are negatively charged, since they are then attracted by the substrate 2 which has a positive potential relative to the target 3.

Preferably, the transport medium used is a flushing gas, a noble gas such as argon, which may be ionized, or a reactive gas such as oxygen, nitrogen or an alkane, alkene or alkyne, which may be ionized.

The particles can also be supplied to the vacuum processing chamber 1 when no plasma 5 is formed therein. This may occur before or after the plasma coating procedure, so that it is possible not only to embed the particles in the layer being produced during the plasma coating procedure, but also to produce an independent particle layer under and/or on this layer. In the example illustrated in FIG. 1, the particles 12 are embedded in the applied layer 13.

In order to form the layer 13, material from the target 3 is removed by the effect of the processing plasma 5 and reacts with the reactive gas present in the plasma 5, producing a compound which precipitates onto the substrate 2 as the layer 13. Particles introduced into the plasma 5 via the nozzles 9 are also deposited, and so they are embedded in the layer 13 in an evenly distributed manner.

Figure 2:
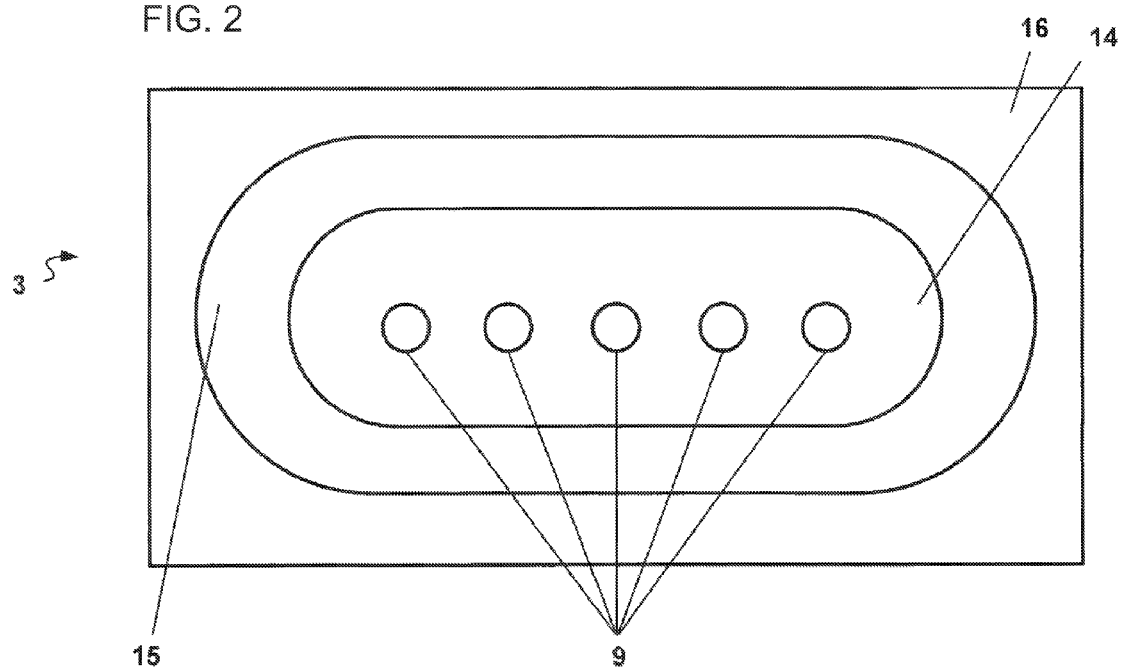
FIG. 2 shows the underside of the target shown in FIG. 1.

FIG. 2 shows the bottom view of the target 3. The nozzles 9 are arranged equidistantly from each other along the longitudinal central line of the target surface. They are in a region 14 of this surface in which the target material is not eroded or only slightly eroded. In an oval region 15 (raise track) around the region 14, however, a great deal of material erosion occurs because it is bombarded with positive ions from the processing plasma 5. In a border region 16 of the target surface, though, the material erosion is minimal. The illustrated arrangement of the nozzles 9 prevents them from being damaged or destroyed by the ion bombardment and nevertheless means that the particles spread out evenly in the plasma.

Depending on the application, it may be advantageous for charged or electrically neutral particles to be introduced into the plasma. If the particles in the storage container 6 do not already have the desired state of charge, then this must be applied to them by the charge transfer unit, for example an electron shower, on their way to the vacuum processing chamber 1. If the particles consist of metal, then if they are to carry a specific charge, they must at least have been provided with an insulating coat.

If electrically neutral particles are introduced into the plasma, then there is no possibility of accelerating them to the substrate by an electric field. The pressure difference between the last pressure stage and the vacuum processing chamber 1 must then be sufficient to provide the particles with such a velocity on entering that they can reach the substrate.

The invention claimed is:

1. A method for applying nano-particles or micro-particles to a plasma coating layer, wherein the layer is applied to a substrate surface by a plasma coating process in a magnetron or a plasmatron having a vacuum processing chamber and a plasma space formed between a target and a substrate, the method comprising:

injecting externally produced electrically neutral or electrically neutralized nano-particles or micro-particles from outside in a spatially distributed manner into the plasma space via nozzles in the vacuum processing chamber between the target and the substrate prior to, during, or after the plasma coating process, wherein the nozzles are arranged on a target surface equidistantly from each other along a longitudinal central line of the target surface; wherein the target surface has an obround shape;

wherein the nano-particles or micro-particles are injected intermittently by a single pulse or a sequence of pulses, the pulse or the sequence of pulses being generated by a pressure difference provided by at least two piezoelectrically actuatable valves arranged one behind the other in a transport pipe for transporting the nano-particles or micro-particles; and applying the nano-particles or micro-particles onto the plasma coating layer on the substrate surface or embedding the nano-particles or micro-particles into the plasma coating layer on the substrate surface.

2. The method according to claim 1, wherein the nozzles are arranged in an areal distribution.

3. The method according to claim 1, which comprises introducing the nano-particles or micro-particles into a region of the plasma space in which no erosion of the target occurs.

4. The method according to claim 1, which comprises introducing the nano-particles or micro-particles into the plasma space with the aid of a flushing gas.

5. The method according to claim 4, wherein the flushing gas is a noble gas or a reactive gas.

6. The method according to claim 4, wherein the flushing gas is argon.

7. The method according to claim 5, wherein the reactive gas is a gas selected from the group consisting of nitrogen, an alkane, alkene, or alkyne.

8. A device for carrying out the method according to claim 1, the device comprising:
- a magnetron or plasmatron having a vacuum processing chamber with a surface of a substrate to be coated facing a surface of a target to be eroded in the vacuum processing chamber, said surface of said target having a region that is excluded from erosion, said region being formed with nozzles which are arranged equidistantly from each other for injecting nano-particles or micro-particles into a plasma space in said vacuum processing chamber between the target and the substrate;
- a transport pipe connected to an external storage container, and a pipe manifold system connecting said transport pipe to a plurality of pipes each connected with a respective one of said nozzles, for transporting the nano-particles or micro-particles from said external storage container to said nozzles;
- wherein each pipe of said plurality of pipes is guided through the magnetron or plasmatron and said target to the associated nozzles; a charge transfer unit disposed in said transport pipe for neutralizing a charge of charged nano-particles or micro-particles; and
- at least two piezoelectrically actuatable valves which are arranged one behind the other in the transport pipe and adapted for injecting clusters by a single pulse or a sequence of pulses,
- the pulse or the sequence of pulses being generated by a pressure difference between the external storage container and the plasma space, wherein the external storage container is kept at an atmospheric pressure.

9. The method according to claim 4, wherein the flushing gas is ionized.

10. A method for applying nano-particles and micro-particles to a plasma coating layer, wherein the layer is applied to a substrate surface by a plasma coating process in a magnetron or a plasmatron having a vacuum processing chamber and a plasma space formed between a target and a substrate, the method comprising:
- introducing externally produced nano-particles and micro-particles formed of electrically conductive material which are coated with a non conductive material from outside in a spatially distributed manner into the plasma space via nozzles into the vacuum processing chamber between the target and the substrate prior to, during, or after the plasma coating process, wherein the nozzles are arranged on a target surface equidistantly from each other along a longitudinal central line of the target surface; wherein the target surface has an obround shape;
- electrically charging the nano-particles and micro-particles prior to introducing the nano-particles and micro-particles into the plasma space; and
- applying the nano-particles and micro-particles onto or embedding the nano-particles and micro-particles into the plasma coating layer on the substrate surface;
- wherein the nano-particles and micro-particles are introduced into the plasma space in a pulse or a sequence of pulses;
- the pulse or the sequence of pulses being generated by a pressure difference between an external storage container and the plasma space, wherein the external storage container is kept at atmospheric pressure.

11. The method according to claim 10, which comprises subjecting the nano-particles and micro-particles in the plasma space to an electrical field producing a movement directed towards the substrate.

12. The method according to claim 10, which comprises introducing the nano-particles and micro-particles into the plasma space with the aid of a flushing gas.

13. The method according to claim 12, wherein the flushing gas is a noble gas or a reactive gas.

14. The method according to claim 13, wherein the flushing gas is ionized.

15. The method according to claim 13, wherein the flushing gas is argon.

16. The method according to claim 13, wherein the reactive gas is a gas selected from the group consisting of nitrogen, an alkane, alkene, or alkyne.

17. A device for carrying out the method according to claim 10, the device comprising:
- a magnetron or plasmatron having a vacuum processing chamber with a surface of a substrate to be coated facing a surface of a target to be eroded in the vacuum processing chamber, said surface of said target having a region that is excluded from erosion, said region being formed with nozzles which are arranged equidistantly from each other for injecting nano-particles and micro-particles into a plasma space in said vacuum processing chamber between the target and the substrate;
- a transport pipe connected to an external storage container, and a pipe manifold system connecting said transport pipe to a plurality of pipes each connected with a respective one of said nozzles, for transporting the nano-particles and micro-particles from said external storage container to said nozzles;
- wherein said plurality of pipes are each guided through the magnetron or plasmatron and said target to the associated nozzles;
- a charge transfer unit disposed in said transport pipe for charging nano-particles and micro-particles; and
- at least two piezoelectrically actuated valves disposed in succession in said transport pipe for introducing the nano-particles and micro-particles in pulses into the plasma space.

* * * * *